United States Patent
Saito et al.

(10) Patent No.: US 12,425,786 B2
(45) Date of Patent: Sep. 23, 2025

(54) SPEAKER DISTORTION COMPENSATION DEVICE AND SPEAKER UNIT

(71) Applicant: Alps Alpine Co., LTD, Tokyo (JP)

(72) Inventors: Yuji Saito, Fukushima (JP); Katsuhiko Egami, Fukushima (JP); Hiroyuki Taguchi, Fukushima (JP)

(73) Assignee: Alps Alpine Co., LTD, Tokyo (JP)

( * ) Notice: Subject to any disclaimer, the term of this patent is extended or adjusted under 35 U.S.C. 154(b) by 265 days.

(21) Appl. No.: 18/103,558

(22) Filed: Jan. 31, 2023

(65) Prior Publication Data

US 2023/0276185 A1    Aug. 31, 2023

(30) Foreign Application Priority Data

Feb. 28, 2022  (JP) ................. 2022-030014

(51) Int. Cl.
*H04R 29/00* (2006.01)
*H03G 9/02* (2006.01)
*H04R 3/00* (2006.01)

(52) U.S. Cl.
CPC .......... *H04R 29/001* (2013.01); *H03G 9/025* (2013.01); *H04R 3/002* (2013.01)

(58) Field of Classification Search
CPC .......... H04R 29/001–003; H04R 3/002; H03G 9/025
See application file for complete search history.

(56) References Cited

U.S. PATENT DOCUMENTS 9,967,664 B1  5/2018  Quek et al.
10,687,141 B2  6/2020  Yasuda et al.
(Continued)

FOREIGN PATENT DOCUMENTS

JP  H0951700 A  2/1997
JP  2008-228214  9/2008
(Continued)

OTHER PUBLICATIONS

European Search Report, dated Sep. 28, 2023, pp. 1-19, issued in Application No. 23155066.6, European Patent Office, Munich, Germany.
(Continued)

*Primary Examiner* — James K Mooney
(74) *Attorney, Agent, or Firm* — Crowell & Moring LLP (57) ABSTRACT

A speaker has a magnetic angle sensor that detects the displacement of the vibration system of the speaker. A non-linearity compensation filter compensates for output distortion due to a non-linear parameter of the speaker. A transfer function of a linear inverse filter is applied so that output distortion is eliminated from the displacement, detected by the magnetic angle sensor, of the vibration system. A controller drives the speaker by using a test signal, and measures a response from the detected displacement of the vibration system. If error between the measured response and the theoretical value, theoretically determined from the design specifications, of the response is small, the controller uses the theoretical value, theoretically determined from the design specifications, of the non-linear parameter as an active non-linear parameter and sets, in the non-linearity compensation filter, a transfer function that compensates for distortion in an output due to the active non-linear parameter.

9 Claims, 8 Drawing Sheets

(56) References Cited

U.S. PATENT DOCUMENTS

2005/0008170 A1  1/2005  Pfaffinger et al.
2017/0006394 A1  1/2017  Risberg et al.

FOREIGN PATENT DOCUMENTS

JP  2010-124026  6/2010
WO  2017/179539  10/2017

OTHER PUBLICATIONS

Ogunfunmi, T., Adaptive Nonlinear System Identification, Sep. 12, 2007, pp. 1-12, Springer Science Business Media, LLC.
Andersen, M. R., Compensation of Nonlinearities in Transducers, May 25, 2005, pp. 1-103, Technical University of Denmark, available at URL https://www2.imm.dtu.dk/pubdb/edoc/imm3871.pdf.

SPEAKER DISTORTION COMPENSATION DEVICE AND SPEAKER UNIT

The present application claims priority to Japanese Patent Application Number 2022-030014, filed Feb. 28, 2022, the entirety of which is hereby incorporated by reference.

BACKGROUND

1. Field of the Disclosure

The present disclosure relates to a technology that compensates for distortion in an output from a speaker with respect to an input.

2. Description of the Related Art

In known technologies, a driving of a speaker is controlled according to equivalent circuits of various speakers or equivalent circuits (see Klippel, Wolfgang, "Modeling the large signal behavior of micro-speakers", 133rd Audio Engineering Society Convention 2012, Paper Number 8749, Oct. 25, 2012, and International Publication No. WO2017/179539).

In another known technology that controls a driving of a speaker according to an equivalent circuit, a voice signal that drives a speaker is compensated according to an equivalent circuit of the speaker so that distortion in an output from the speaker with respect to an input is eliminated, (see Japanese Patent No. 6522668).

In known motional feedback technologies, a sensor that detects a vibration of a diaphragm of a speaker is provided so as to control a driving of the speaker according to the vibration detected by the sensor (see JP 2008-228214 A and JP 2010-124026 A, for example).

SUMMARY

It can be thought that a motional feedback technology is used to detect a vibration of a diaphragm of a speaker and that a voice signal that drives the speaker is compensated according to the detected vibration so that distortion in the speaker is eliminated.

In this case, it can also be thought that, to eliminate the distortion in the speaker, an adaptive filter is applied to compensate the voice signal and that a coefficient of the adaptive filer is updated so that error, which is the difference between ideal vibration and the detected vibration, is minimized.

Parameters that define characteristics of a speaker are classified into linear parameters and non-linear parameters.

Figure 7:
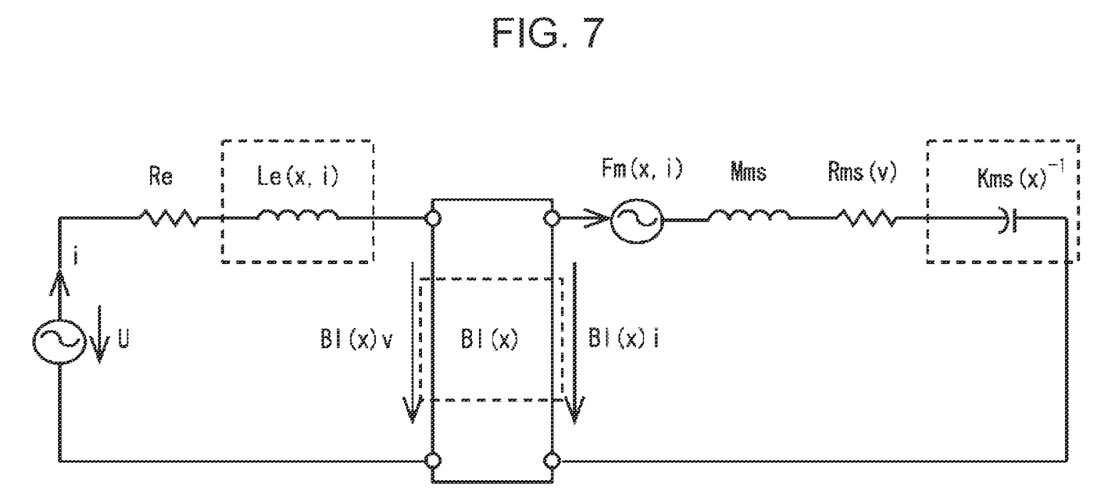
FIG. 7 illustrates an example of an equivalent circuit of a speaker.

In an equivalent circuit, illustrated in FIG. 7, of a speaker, for example, Bl, KMS, Le(x, i) and the like indicate non-linear parameters.

The equivalent circuit in FIG. 7 is the equivalent circuit indicated in "Modeling the large signal behavior of micro-speakers" mentioned above. Symbols used in the equivalent circuit are as follows:

Re: electrical resistance
Le(x, i): electrical inductance
Bl(x): force factor
Fm(x, i): reluctance force
Mms: mechanical mass
Rms(v): mechanical resistance
Kms(x): stiffness If an adaptive filter is configured so as to adapt to non-linear parameters of this type of speaker as well, processing by the adaptive filer and its structure become large, resulting in a high cost.

A possible solution to this is to provide, ahead of the adaptive filter, a non-linear distortion compensation filter that compensates for distortion due to a non-linear parameter of the speaker so that the adaptive filter takes charge of only compensation for distortion due to the linear parameter of the speaker.

In this solution, however, since there are variations in each non-linear parameter among speakers even if they are the same type of products, the non-linear parameter needs to be identified for each speaker before it is used. If a behavior of each speaker such as the displacement of the vibration system of the speaker is measured by using a laser displacement meter or another appropriate measurement instrument to identify a non-linear parameter of the speaker, a process having a relatively large burden needs to be added to the manufacturing of the speaker.

Another problem with this solution is that if a non-linear parameter of the speaker changes due to the influence of temperature or the like after the use of the speaker has started, the non-linear distortion compensation filter cannot appropriately compensate for distortion due to a non-linear parameter of the speaker.

In view of this, an object of the present disclosure is to identify a non-linear parameter of a speaker with a relatively simple structure.

Another object of the present disclosure is to appropriately compensate for distortion due to a non-linear parameter of the speaker in a stable manner even after the use of the speaker has started.

To attain the above objectives, forms of a speaker distortion compensation device, according to the present disclosure, that compensates for distortion in an output from a speaker with respect to an input signal has: a sensor configured to detect the vibration of a vibration system included in the speaker; a non-linearity compensation filter configured to accept the input signal; a tunable filter configured to accept an output from the non-linearity compensation filter and to output an output signal that drives the speaker; an adaptive algorithm execution unit that is configured to execute a predetermined adaptive algorithm to perform an adaptive operation in which a transfer function of the tunable filter is updated so that vibration detected by the sensor does not undergo distortion with respect to the input signal; and a controller configured to perform, as an initial setting operation for the speaker distortion compensation device, an operation in which the controller calculates a non-linear parameter of the speaker as an active non-linear parameter and sets, in the non-linearity compensation filter, a transfer function that compensates for distortion in the output from the speaker with respect to the input signal, the distortion being due to the calculated active non-linear parameter. In the initial setting operation, the controller is configured to drive the speaker by using a predetermined test signal and measuring a response from the speaker as a measured response value, the response being measured from the vibration of the vibration system, the vibration being detected by the sensor with respect to the test signal. In the initial setting operation, the controller is also configured to calculate error between the measured response value and a theoretical response value, which is the theoretical value of the response from the speaker when the non-linear parameter of the speaker, the non-linear parameter being theoretically determined from the design specifications of the speaker, is taken as a non-linear parameter theoretical value and the non-linear parameter theoretical value is the non-linear parameter of the speaker. In the initial setting operation, when the calculated error is smaller than a threshold level, the controller is also configured to calculate the non-linear parameter theoretical value as the active non-linear parameter.

This speaker distortion compensation device may be structured so that when the calculated error is not smaller than the predetermined level, the controller may calculate, as the active non-linear parameter, a non-linear parameter that causes the response from the speaker to adapt to the measured response value.

In this case, a plurality of pairs may be stored in advance in the controller, each pair being formed from a candidate active non-linear parameter, which is a candidate of the active non-linear parameter, and a reference response, which is the theoretical value of the response from the speaker when the candidate active non-linear parameter is the non-linear parameter of the speaker. When the calculated error is not smaller than the predetermined level, the controller may calculate, as the active non-linear parameter, the candidate active non-linear parameter paired with the reference response closest to the measured response value.

With the speaker distortion compensation device described above, when a response from the speaker is measured by using a sensor employed in adaptation of the transfer function of the tunable sensor used to compensate for distortion in an output due to the non-linear parameter of the speaker, the non-linear parameter can be identified without having to use a laser displacement meter or another external measurement instrument.

When the error with respect to the response, theoretically determined from the design specifications of the speaker, of the speaker is small, a non-linear parameter can be identified in relatively simple processing in which the theoretical value of the non-linear parameter is used as the non-linear parameter of the speaker without alteration.

When the above structure is used in which when the calculated error is not smaller than the predetermined level, the controller calculates, as the active non-linear parameter, the candidate active non-linear parameter paired with the reference response closest to the measured response value, even if the error with respect to the response, theoretically determined from the design specifications of the speaker, of the speaker is large, a non-linear parameter can be identified in relatively simple processing.

Therefore, a non-linear parameter of the speaker can be identified in relatively simple processing.

A status detection means that detects the status of the speaker may be provided in the non-linearity compensation filter. After the actual operation of the speaker distortion compensation device has started, the controller may record a history of the status, detected by the status detection means, of the speaker. Then, the controller may infer a change in the non-linear parameter of the speaker from the recorded history, may update the active non-linear parameter so as to follow the inferred change, and may set, in the non-linearity compensation filter, a transfer function that compensates for distortion in the output from the speaker with respect to the input signal, the distortion being due to the updated active non-linear parameter.

With this type of speaker distortion compensation device, after the start of an actual operation, the transfer function of the non-linearity compensation filter is updated so as to follow a change caused in a non-linear parameter due to the accumulated status. Therefore, it is possible to appropriately compensate for distortion due to a non-linear parameter of the speaker in a stable manner.

In the above speaker distortion compensation device, one of the non-linear parameters may be a force factor in an equivalent circuit of the speaker.

To attain the above objectives, forms of a speaker distortion compensation device, according to the present disclosure, that compensates for distortion in an output from a speaker with respect to an input signal has: a sensor configured to detect the vibration of a vibration system included in the speaker; a non-linearity compensation filter configured to accept the input signal and include a transfer function that compensates for distortion in the output from the speaker with respect to the input signal, the distortion being due to a non-linear parameter of the speaker; a tunable filter that accepts an output from the non-linearity compensation filter and outputs an output signal that drives the speaker; an adaptive algorithm execution unit configured to execute a predetermined adaptive algorithm to perform an adaptive operation in which a transfer function of the tunable filter is updated so that vibration detected by the sensor does not undergo distortion with respect to the input signal; a temperature detection means configured to detect the temperature of the speaker; and a controller. One of the non-linear parameters is a force factor in an equivalent circuit of the speaker. The controller is configured to record a history of temperatures, detected by the temperature detection means, of the speaker. Then, the controller is configured to record an inference of the electromotive force of a magnet in the speaker at the current time from the amount of demagnetization of the magnet, the amount being inferred from the recorded history of temperatures, to calculate the force factor in the equivalent circuit of the speaker at the current time by applying the inferred electromotive force of the magnet, and to update the transfer function of the non-linearity compensation filter to a transfer function that compensates for distortion in the output from the speaker with respect to the input signal, the distortion being due to each non-linear parameter in the equivalent circuit, in which the calculated force factor is included as a non-linear parameter, of the speaker.

With this type of speaker distortion compensation device, after the start of an actual operation, the transfer function of the non-linearity compensation filter is updated so as to follow a temperature-depending change in a non-linear parameter, the change being caused when the magnet in the speaker is demagnetized. Therefore, it is possible to appropriately compensate for distortion due to a non-linear parameter of the speaker in a stable manner.

The present disclosure also provides a speaker unit that has the speaker and the speaker distortion compensation device described above so that they are combined with each other.

As described above, implementations of the present disclosure can identify a non-linear parameter of a speaker with a relatively simple structure.

The present disclosure can also appropriately compensate for distortion due to a non-linear parameter of the speaker in a stable manner even after the use of the speaker has started.

BRIEF DESCRIPTION OF THE DRAWINGS

FIGS. 5A1, 5A2, 5B1, and 5B2 illustrate examples of calculating non-linear parameter initial values in an embodiment of the present disclosure;

DETAILED DESCRIPTION

Embodiments of the present disclosure will be described below.

Figure 1:
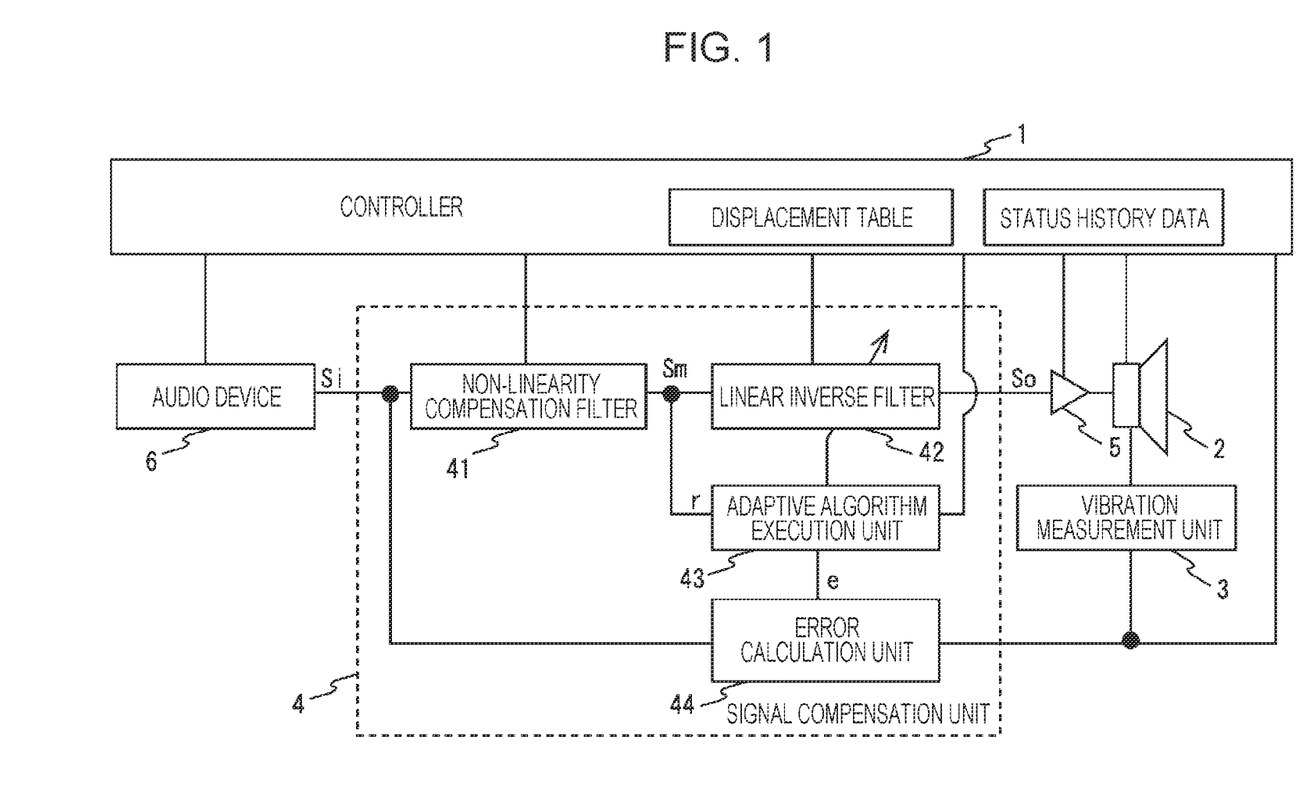
FIG. 1 illustrates a structure of one form of an acoustic system in an embodiment of the present disclosure.

FIG. 1 illustrates the structure of one form of an acoustic system in an embodiment of the present disclosure.

As illustrated in the drawing, the acoustic system has a controller 1, a speaker 2, a vibration measurement unit 3 that measures the vibration or displacement of the speaker 2, a signal compensation unit 4 that outputs an output signal So, an amplifier 5 that accepts the output signal So and drives the speaker 2, and an audio device 6 that outputs an input signal Si, which is a voice signal.

The signal compensation unit 4 compensates the input signal Si output from the audio device 6, and outputs the resulting signal as the output signal So. The amplifier 5 converts the output signal So to an analog signal (voltage signal) and amplifies the resulting signal to drive the speaker 2.

Figure 2A:
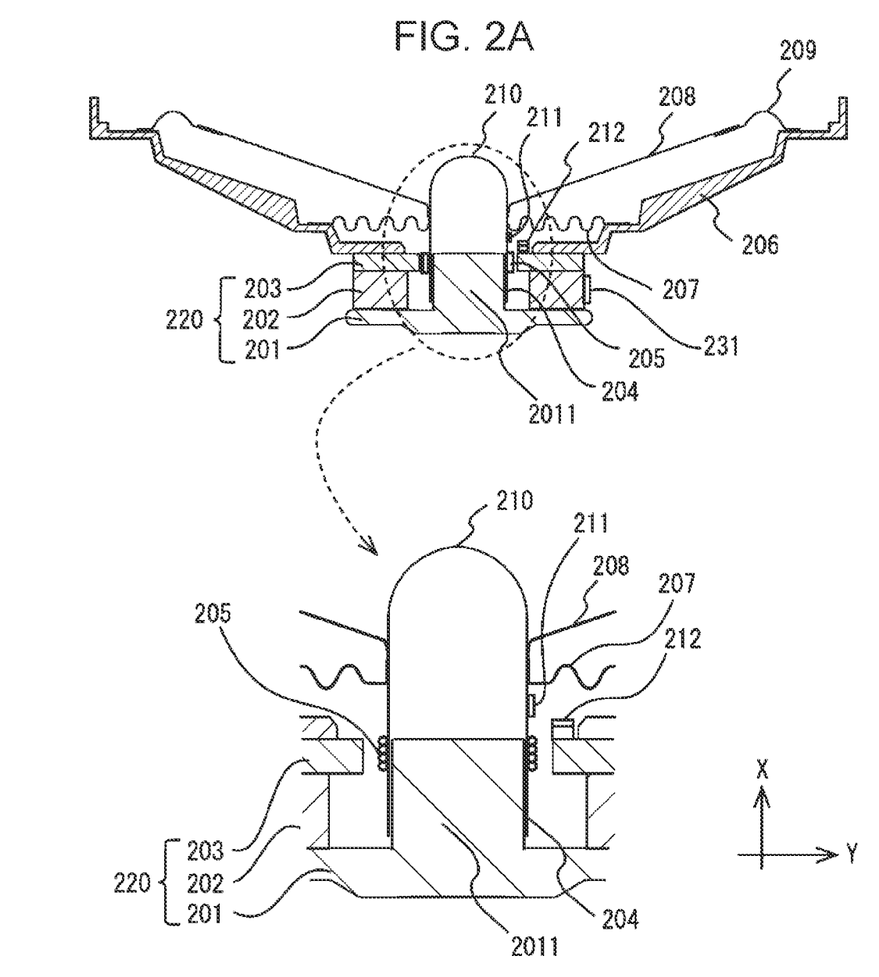
FIG. 2A and FIG. 2B illustrate a structure of one form of a speaker in an embodiment of the present disclosure.

FIG. 2A illustrates one form of a structure of the speaker 2.

As illustrated in the drawing, the speaker 2 has a yoke 201, a magnet 202, a top plate 203, a voice coil bobbin 204, a voice coil 205, a frame 206, a damper 207, a diaphragm 208, an edge 209, and a dust cap 210.

The yoke 201 has a convex part 2011 protruding forward at the central portion, with the top of the drawing taken as the forward of a front speaker and the bottom of the drawing taken as the backward of the front speaker. The magnet 202, which is shaped like a ring, is disposed outside the convex part 2011. The top plate 203, which is also shaped like a ring, is disposed on the magnet 202. The top plate 203 is formed from a conductive material such as iron. The yoke 201, magnet 202, and top plate 203 constitute a magnetic circuit 220.

The voice coil bobbin 204 has a hollow cylindrical shape. The voice coil 205, to which a signal is applied from the amplifier 5, is wound on the outer circumference of the voice coil bobbin 204. The convex part 2011 of the yoke 201 is inserted from the back into the hollow of the voice coil bobbin 204 in such a way that the voice coil bobbin 204 can move toward and away from the yoke 201. The voice coil 205 is placed at a position, between the top plate 203 and the convex part 2011 of the yoke 201, at which a magnetic flux generated by the magnetic circuit 220 inside the inner circumferential end of the top plate 203 passes through the voice coil 205.

The diaphragm 208 has a shape similar to the shape of the side surface of a truncated cone the height direction of which is substantially the front-back direction of the front speaker. The outer circumferential end of the diaphragm 208 is linked to the front end of the frame 206 through the edge 209. The inner circumferential end of the diaphragm 208 is fixed to the front end of the voice coil bobbin 204.

In the structure, as described above, of the speaker 2, when a signal is applied from the amplifier 5 to the voice coil 205, due to a magnetic vector generated from the magnetic circuit 220 and to the electromagnetic effect of an audio signal flowing in the voice coil 205, the voice coil bobbin 204 vibrates in the front-back direction according to the amplitude of the audio signal. The vibration of the voice coil bobbin 204 causes the diaphragm 208 linked to the voice coil bobbin 204 to vibrate, generating a sound matching the signal from the amplifier 5.

The axial direction and radial direction of the speaker 2 will be respectively taken as the X direction and Y direction, as illustrated in the drawing. A displacement detection magnet 211 and a magnetic angle sensor 212 are assembled to this speaker 2 as a sensor that detects the displacement of the diaphragm 208 in the X direction (front-back direction).

The displacement detection magnet 211 is fixed to the voice coil bobbin 204 so that the displacement detection magnet 211 moves upward and downward together with the voice coil bobbin 204. The magnetic angle sensor 212 is fixed to, for example, the top of the 203 so that the position of the magnetic angle sensor 212 does not change with respect to the magnetic circuit 220.

Figure 2B:
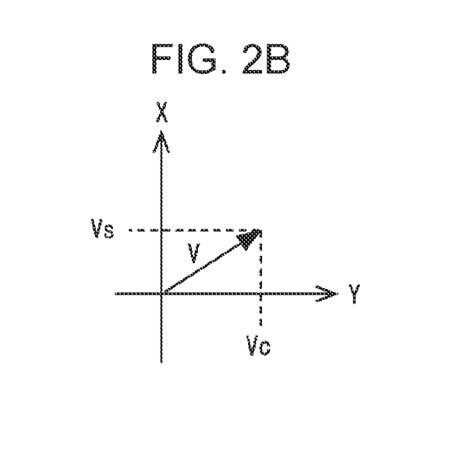

The magnetic angle sensor 212 detects the magnitudes of the X-directional component and Y-directional component of a composite vector V, illustrated in FIG. 2B, which is created from a magnetic vector generated by the magnetic circuit 220 and a magnetic vector generated by the displacement detection magnet 211. The magnetic angle sensor 212 then outputs, to the vibration measurement unit 3, an X detection value Vs, indicating the magnitude of the X-directional component, and a Y detection value Vc, indicating the magnitude of the Y-directional component.

When the voice coil bobbin 204 is displaced and the displacement detection magnet 211 is thereby displaced in the X direction, the magnitude of the composite vector V (a combination of the magnitude of the X-directional component and the magnitude of the Y-directional component) and its orientation change accordingly. Therefore, the amount of X-directional displacement of the vibration system of the speaker 2 can be calculated from the X detection value Vs and Y detection value Vc.

A temperature sensor 231 is attached to the magnet 202 in the speaker 2. The temperature sensor 231 outputs detected temperature to the controller 1.

Referring again to FIG. 1, the vibration measurement unit 3 measures the vibration or displacement of the vibration system of the speaker 2, the vibration system including the voice coil bobbin 204, the diaphragm 208, and the like, from an output from the magnetic angle sensor 212 in the speaker 2, and outputs the measured value to controller 1 and signal compensation unit 4.

The controller 1 accepts, from the audio device 6, information as to whether there is a voice output, an output level (a volume or the like), and other information. The controller 1 also accepts, from the speaker 2, information about an input voltage and an input current.

The signal compensation unit 4 has a non-linearity compensation filter 41, a linear inverse filter 42, an adaptive algorithm execution unit 43, and an error calculation unit 44.

The input signal Si output from the audio device 6 passes through the non-linearity compensation filter 41 and enters the linear inverse filter 42 as an intermediate compensation signal Sm. The intermediate compensation signal Sm passes through the linear inverse filter 42 and is output as the output signal So. The output signal So passes through the amplifier 5 and is output to the speaker 2.

Transfer functions (filter coefficients) of the non-linearity compensation filter 41 are switchable from the controller 1. The controller 1 sets a transfer function of the non-linearity compensation filter 41 as a transfer function that compensates for distortion due to a non-linear parameter of the speaker 2.

The error calculation unit 44 calculates the difference between the vibration of the speaker 2 when the vibration is free from distortion with respect to the input signal Si and the actual vibration, measured by the vibration measurement unit 3, of the speaker 2.

The linear inverse filter 42 is a tunable filter. The adaptive algorithm execution unit 43 and linear inverse filter 42 constitute an adaptive filter. The adaptive algorithm execution unit 43 takes the intermediate compensation signal Sm as a reference signal r, and also takes the difference calculated by the error calculation unit 44 as error e. Then, the adaptive algorithm execution unit 43 performs an adaptive operation in which a transfer function (filter coefficient) of the linear inverse filter 42 is updated by using a least mean square (LMS) algorithm or the like so that the error e is minimized.

As a result of this adaptive operation, the transfer function that compensates for distortion in an output from the speaker 2 with respect to the input signal Si, the distortion being caused by a non-linear parameter of the speaker 2, is set in the linear inverse filter 42.

Next, the controller 1 executes non-linear parameter initial value calculation processing at the time of initial setting, which is performed before the use of the acoustic system starts, to calculate a non-linear parameter of the speaker 2, after which the controller 1 sets, in the non-linearity compensation filter 41, a transfer function that compensates for distortion caused by the calculated non-linear parameter.

Figure 3:
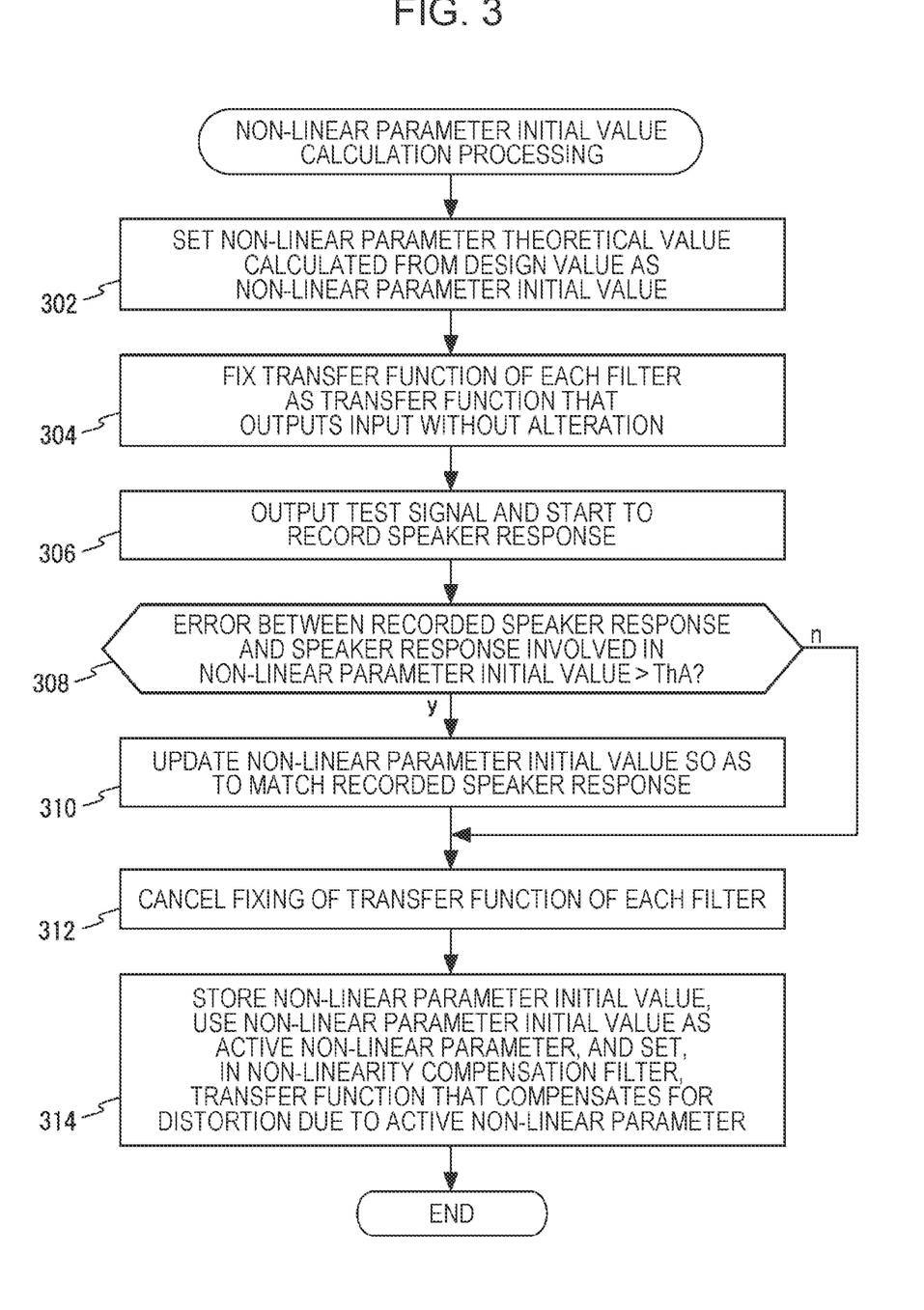
FIG. 3 is a flowchart indicating non-linear parameter initial value calculation processing in an embodiment of the present disclosure.

FIG. 3 indicates a procedure for this non-linear parameter initial value calculation processing.

As indicated in the drawing, in non-linear parameter initial value calculation processing, the controller 1 first calculates a theoretical value for a non-linear parameter from data indicated in the design specifications of the speaker 2, the theoretical value being true when the speaker 2 is as per the design specifications, and takes the calculated theoretical value as the non-linear parameter initial value (step 302).

The controller 1 then fixes the transfer functions of the non-linearity compensation filter 41 and linear inverse filter 42 as transfer functions that output an input without alteration (step 304).

Next, the controller 1 controls the audio device 6 to cause it to output a predetermined test signal (a frequency sweep signal, for example), and records the vibration or displacement, measured by the vibration measurement unit 3, of the vibration system of the speaker 2 as a response of the speaker 2 to the test signal (step 306).

The controller 1 then checks whether error (represented by an absolute value) exceeds a predetermined threshold ThA, the error being between the recorded response of the speaker 2 and the response of the speaker 2 when the non-linear parameter, calculated from the non-linear parameter initial value, of the speaker 2 really has the non-linear parameter initial value (step 308).

If the error exceeds the threshold value ThA, the controller 1 updates the non-linear parameter initial value to a non-linear parameter with which the recorded response of the speaker 2 is obtained (step 310).

The controller 1 then cancels the fixing of the transfer functions of the non-linearity compensation filter 41 and linear inverse filter 42 (step 312) and stores the non-linear parameter initial value. The controller 1 uses the non-linear parameter initial value as an active non-linear parameter and sets, in the non-linearity compensation filter 41, a transfer function that compensates for distortion due to the active non-linear parameter (step 314), after which the controller 1 terminates the non-linear parameter initial value calculation processing.

If the controller 1 decides in step 308 that the error is not greater than the threshold value ThA, the controller 1 cancels the fixing of the transfer functions of the non-linearity compensation filter 41 and linear inverse filter 42 (step 312) and stores the non-linear parameter initial value. The controller 1 uses the non-linear parameter initial value as the active non-linear parameter and sets, in the non-linearity compensation filter 41, a transfer function that compensates for distortion due to the active non-linear parameter (step 314), after which the controller 1 terminates the non-linear parameter initial value calculation processing.

In the calculation, in step 302, of the non-linear parameter initial value that is a theoretical value for the non-linear parameter when the speaker 2 is as per the design specifications, the following is performed for, for example, the force factor Bl(x) non-linear parameter.

Figure 4A:
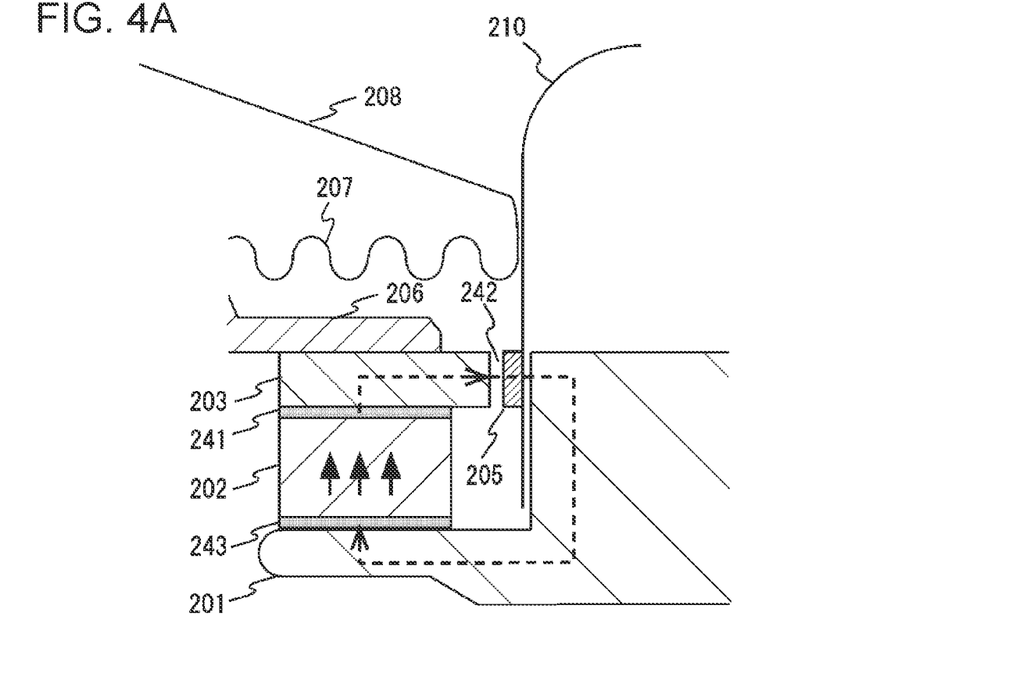
FIG. 4A and FIG. 4B illustrate an example of calculating an initial value of a force factor Bl(x) in an embodiment of the present disclosure.
Figure 4B:
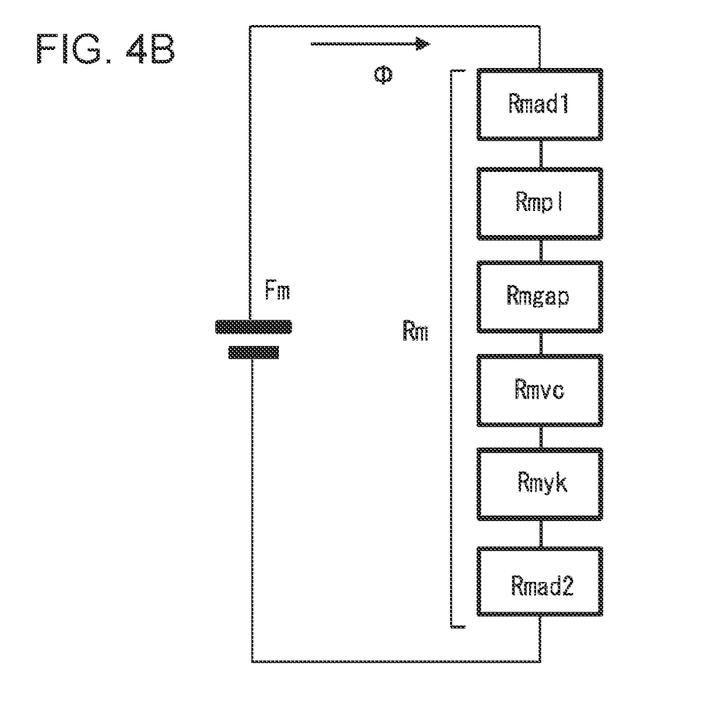

In the magnetic circuit 220 in the speaker 2 having the structure illustrated in FIG. 4A, a combined resistance Rm is connected to the electromotive force Fm of the magnet 202, the combined resistance Rm being formed by directly combining a magnetic resistance Rmad1 of an adhesive 241, with which the magnet 202 and top plate 203 are bonded together, a magnetic resistance Rmpl of the top plate 203, a magnetic resistance Rmgap of air 242 in the speaker 2, a magnetic resistance Rmvc of the voice coil 205, a magnetic resistance Rmyk of the yoke 201, and a magnetic resistance Rmad2 of an adhesive 243, with which the yoke 201 and magnet 202 are bonded together, as illustrated in FIG. 4B.

The magnetic resistance Rmad1 of the adhesive 241, with which the magnet 202 and top plate 203 are bonded together, is calculated from the type, indicated in the design specifications, of the adhesive 241. The magnetic resistance Rmpl of the top plate 203 is calculated from the material and volume, indicated in the design specifications, of the top plate 203. The magnetic resistance Rmgap of the air 242 in the speaker 2 is calculated from the volume, indicated in the design specifications, of the air 242. The magnetic resistance Rmvc of the voice coil 205 is calculated from the length 1, cross-sectional area, and material, indicated in the design specifications, of the voice coil 205. The magnetic resistance Rmyk of the yoke 201 is calculated from the material and volume, indicated in the design specifications, of the yoke 201. The magnetic resistance Rmad2 of the adhesive 243, with which the yoke 201 and magnet 202 are bonded together, is calculated from the type, indicated in the design specifications, of the adhesive 243.

The electromotive force Fm of the magnet 202 is calculated from the material and volume, indicated in the design specifications of the speaker 2, of the magnet 202.

When the magnetic flux passing through the voice coil 205 from the magnetic circuit 220 in FIG. 4B according to the Hopkinson's law is denoted ϕ, the following holds.

$$Fm = Rm\phi$$

If the displacement of the vibration system in the axial direction is x, when a linkage area, which is an area in which the magnetic flux between the top plate 203 and the yoke 201 passes through the voice coil 205, is denoted S(x) and the magnetic flux density is denoted B, the following holds.

$\phi = BS(x)$

Therefore, the following holds.

$B(x) = Fm/RmS(x)$

When the length of the voice coil 205 is denoted 1, the following holds.

$Bl(x) = B(x)l = Fml/RmS(x)$

Therefore, Bl(x) is obtained for a plurality of values of x within the range of the vibration of the vibration system to obtain an approximating curve that links the obtained values of Bl(x). The approximating curve is regarded as the theoretical value of the force factor Bl(x) non-linear parameter when the speaker 2 is as per the design specification, and the theoretical value is taken as the non-linear parameter initial value of the force factor Bl(x).

In step 308, a decision as to whether the error exceeds the threshold value ThA is made, for example, as described below.

The theoretical value, obtained in step 302, of the non-linear parameter when the speaker 2 is as per the design specifications is applied to an equivalent circuit of the speaker 2. The response of the speaker 2 when the theoretical value obtained in step 302 is a non-linear parameter of the speaker 2 is calculated as a design speaker response. Then, a decision is made as to whether the error of the recorded response of the speaker 2 with respect to the design speaker response exceeds the threshold value ThA.

In step 310, the non-linear parameter initial value is updated to the non-linear parameter with which the recorded response of the speaker 2 is obtained, for example, as described below.

When data items in the specifications of the speaker 2 have errors that have a plurality of error values slightly different from one another within the manufacturing tolerance for the speaker 2, the theoretical value of the non-linear parameter and the response of the speaker 2 are respectively calculated as a to-be-updated non-linear parameter theoretical value and a reference speaker response corresponding to the to-be-updated non-linear parameter theoretical value. This to-be-updated non-linear parameter theoretical value can be calculated by changing data in the specification by an amount equal to the corresponding error and obtaining the theoretical value of the non-linear parameter as with the non-linear parameter initial value.

In the controller 1, the non-linear parameter initial value is updated to the to-be-updated non-linear parameter theoretical value corresponding to the reference speaker response closest to the recorded response of the speaker 2.

Figure 5A:
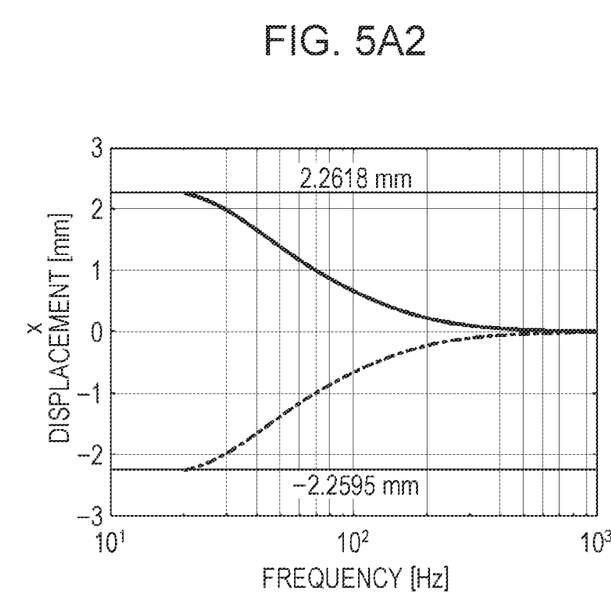
Figure 5A:
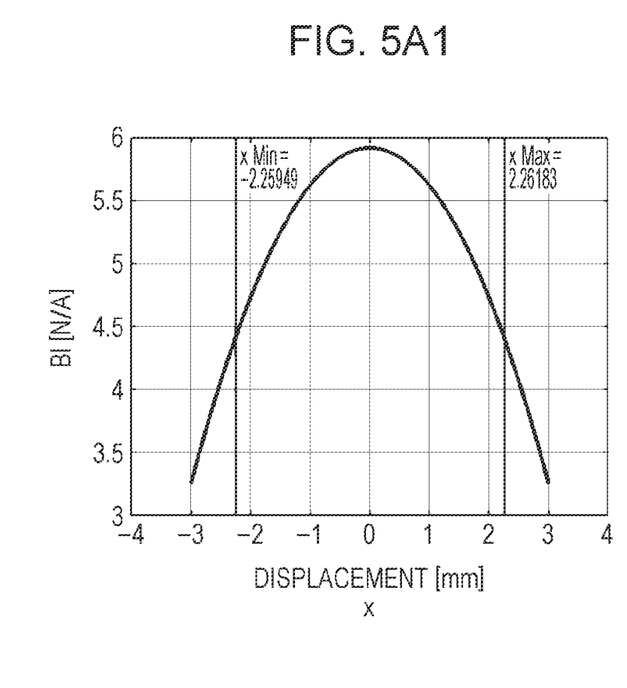

In the update of the non-linear parameter initial value of the force factor Bl(x) non-linear parameter, for example, the non-linear parameter initial value, which is the theoretical value of the force factor Bl(x) non-linear parameter when the speaker 2 is as per the design specifications, is calculated in advance as illustrated in FIG. 5A1. The design speaker response is calculated for the non-linear parameter initial value indicated in FIG. 5A1 is calculated as illustrated in FIG. 5A2.

Figure 5B:
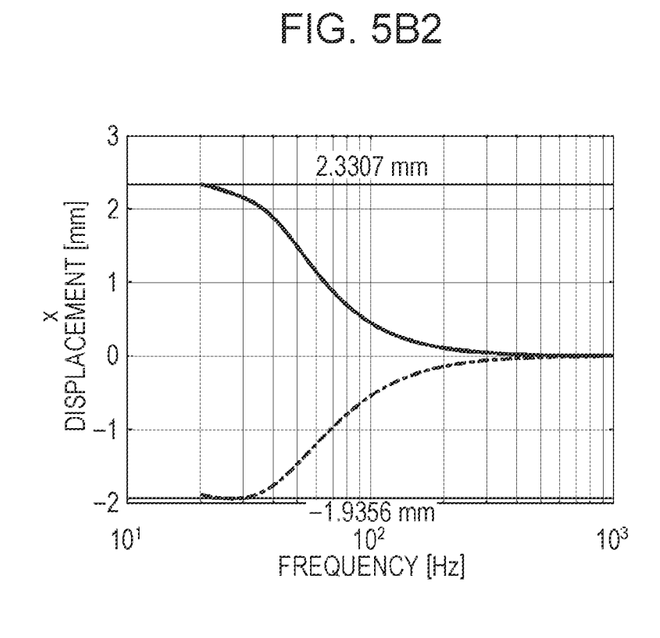
Figure 5B:
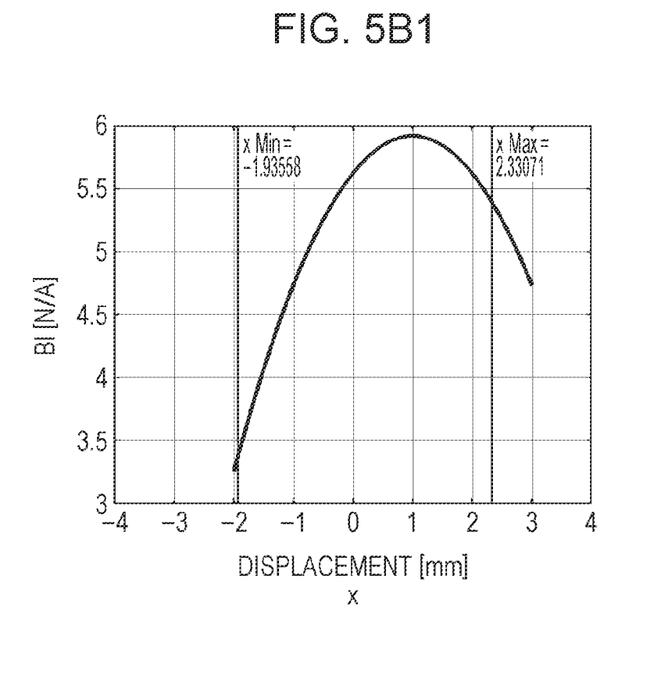

When the to-be-updated non-linear parameter theoretical value of the force factor Bl(x) and the reference speaker response are calculated for a plurality of error values, the to-be-updated non-linear parameter theoretical value, calculated for a certain error value, of the force factor Bl(x) is as indicated in FIG. 5B1 and the reference speaker response calculated for the to-be-updated non-linear parameter theoretical value, indicated in FIG. 5B1, of the force factor Bl(x) is as indicated in FIG. 5B2. FIG. 5B1 represents theoretical values of the force factor Bl(x) when there is error with respect to the design specifications at the center of the vibration of the vibration system, within the manufacturing tolerance.

In FIGS. 5A1 and 5B1, Bl is indicated on the vertical axis and the displacement x of the vibration system in the axial direction is indicated on the horizontal axis. In FIGS. 5A2 and 5B2, the displacement x of the vibration system in the axial direction is indicated on the vertical axis and frequency is indicated on the horizontal axis.

When the error of the speaker response, recorded in step 306, to the test signal with respect to the design speaker response indicated in FIG. 5A2 exceeds the threshold value ThA and the reference speaker response closest to the recorded speaker response to the test signal, the reference speaker response being one of the calculated reference speaker responses, is the reference speaker response in FIG. 5B2, the non-linear parameter initial value of the force factor Bl(x) is updated to the to-be-updated non-linear parameter theoretical value in FIG. 5B1.

This completes the description of the non-linear parameter initial value calculation processing performed by the controller 1.

In the description above, a non-linear parameter initial value, a design speaker response, to-be-updated non-linear parameter theoretical values for various error values within manufacturing tolerance, and a reference speaker response have been calculated in non-linear parameter initial value calculation processing. However, these values may be calculated in advance in an external device according to the design specifications and manufacturing tolerance, and may then be stored in advance in the controller 1 in the acoustic system, instead of being calculated in the controller 1. Then, the stored values may be used in non-linear parameter initial value calculation processing.

In this type of non-linear parameter initial value calculation processing, a non-linear parameter can be identified by using the magnetic angle sensor 212 employed in adaptation of a transfer function of the linear inverse filter 42, the transfer function compensating for distortion in an output due to a non-linear parameter of the speaker 2, to measure the response of the speaker 2, without having to use a laser displacement meter or another external measurement instrument.

When error with respect to the response of the speaker 2 is small, the response is being theoretically determined from the design specifications of the speaker 2, a non-linear parameter can be identified in relatively simple processing in which the theoretical value of the non-linear parameter is used as the active non-linear parameter of the speaker 2 without alteration.

Even if the above calculated error is not small, a non-linear parameter can be identified in relatively simple processing in which the to-be-updated non-linear parameter theoretical value corresponding to the reference speaker response closest to the recorded response of the speaker 2 is just updated to the active non-linear parameter in the controller 1.

Next, while in operation after the use of the acoustic system has started, the controller 1 accumulates the following as status history data: a history of information as to whether there is a voice output, an output level (a volume or the like), and the like indicated by information accepted from the audio device 6, a history of input voltages and input currents indicated by information accepted from the speaker 2, and a history of temperatures detected by the temperature sensor 231.

While in operation after the use of the acoustic system has started, the controller 1 periodically performs in-operation non-linear parameter update processing to infer the non-linear parameter of the speaker 2 at the current time. If a change in the non-linear parameter at the current time from the active non-linear parameter is large, the controller 1 updates the transfer function of the non-linearity compensation filter 41 to a transfer function that compensates for distortion due to the inferred non-linear parameter at the current time.

Figure 6:
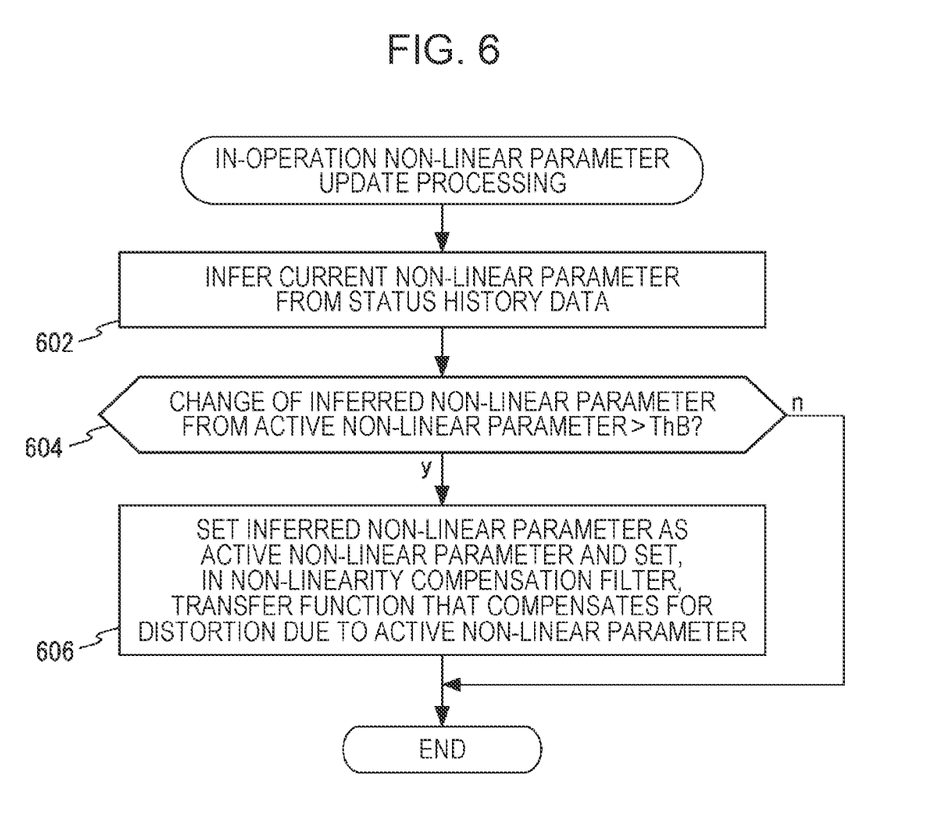
FIG. 6 is a flowchart illustrating in-operation non-linear parameter update processing in an embodiment of the present disclosure.

FIG. 6 illustrates this in-operation non-linear parameter update processing.

As illustrated in the drawing, in in-operation non-linear parameter update processing, the controller 1 infers the non-linear parameter of the speaker 2 at the current time from the status history data (step 602).

The controller 1 then checks whether the amount of change (represented by an absolute value) of the inferred non-linear parameter at the current time from the active non-linear parameter at the current time exceeds a predetermined threshold value ThB (step 604). If the amount of change is not larger than the threshold value ThB, the controller 1 terminates the in-operation non-linear parameter update processing executed this time.

If the amount of change exceeds the threshold value ThB, the controller 1 updates the active non-linear parameter to the inferred non-linear parameter at the current time and updates the transfer function of the non-linearity compensation filter 41 to a transfer function that compensates for distortion due to the updated active non-linear parameter (step 606).

Finally, the controller 1 terminates the in-operation non-linear parameter update processing executed this time.

In step 602, the non-linear parameter of the speaker 2 at the current time is inferred from the status history data as described below.

A displacement table is stored in advance in the controller 1, the displacement table including the accumulated amount of status related to the non-linear parameter of the speaker 2 and the amount of displacement in data in the specifications related to the non-linear parameter of the speaker 2 in correspondence to each other. The controller 1 acquires, from the displacement table, the amount of displacement in data in the specifications of the speaker 2, the amount corresponding to the accumulated amount, obtained from the status history data, of status, and obtains the value of data in the specifications of the speaker 2 at the current time. Then, the controller 1 updates the stored non-linear parameter initial value so as to match the obtained value of the data in the specifications and infers the non-linear parameter at the current time.

Specifically, in the inference of the force factor $Bl(x)$ non-linear parameter, for example, the accumulated amount of information about temperature at which the magnet 202 is demagnetized and the amount of demagnetization of the magnet 202 are stored in advance in the displacement table in correspondence to each other.

In the inference of the force factor $Bl(x)$ at the current time, the controller 1 first calculates a history of temperatures of the magnet 202 from the status history data. As the temperature of the magnet 202, temperature detected by the temperature sensor 231 attached to the magnet 202 can be used, the temperature being indicated in the status history data. Instead of using the temperature sensor 231, however, the temperature of the magnet 202 may be calculated from heat transferred to the magnet 202, the heat being part of Joule heat generated by the voice coil 205, the transferred heat being indicated in the status history data, the Joule heat being determined from the input voltage and input current of the speaker 2.

The controller 1 obtains, from the history of temperatures of the magnet 202, the accumulated amount of information about the temperature of the magnet 202 at which the magnet 202 is demagnetized (the accumulated amount of information is, for example, a time-integrated value of temperature at which demagnetization occurs). The controller 1 then acquires, from the displacement table, the amount of demagnetization of the magnet 202 in correspondence to the obtained accumulated amount, and infers, as the force factor $Bl(x)$ at the current time, the force factor $Bl(x)$ in a case in which the acquired amount of demagnetization of the magnet 202 and the electromotive force Fm of the magnet 202 are reduced from their initial values.

Since the expression $Bl(x)=B(x)l=Fml/RmS(x)$ holds as described above, the force factor $Bl(x)$ at the current time is a value obtained by reducing the force factor $Bl(x)$, stored as the non-linear parameter initial value, in the same ratio as the ratio of the amount of demagnetization of the magnet 202.

This completes the description of the in-operation non-linear parameter update processing performed by the controller 1.

In this type of in-operation non-linear parameter update processing, after the start of an actual operation, the transfer function of the non-linearity compensation filter 41 is updated so as to follow the change in the non-linear parameter due to the accumulated status. Therefore, it is possible to appropriately compensate for distortion due to a non-linear parameter of the speaker 2 in a stable manner.

In the embodiment described above, the vibration measurement unit 3 and signal compensation unit 4 may be integrated with the speaker 2 as part of a speaker unit.

Although embodiments and implementations of the present disclosure have been described in detail above, the present disclosure is not limited to the specific embodiments, and various modifications and changes can be made within the scope of the disclosure set forth in the claims. Therefore, it is intended that this disclosure not be limited to the particular embodiments disclosed, but that the disclosure will include all embodiments and implementations falling within the scope of the appended claims.

The invention claimed is:

1. A speaker distortion compensation device configured to compensate for distortion in an output from a speaker with respect to an input signal, the speaker distortion compensation device comprising:
    a sensor configured to detect vibration of a vibration system included in the speaker;
    a non-linearity compensation filter configured to accept the input signal;
    a tunable filter configured to accept an output from the non-linearity compensation filter and to output an output signal that drives the speaker;
    an adaptive algorithm execution unit configured to execute a predetermined adaptive algorithm to perform an adaptive operation in which a transfer function of the tunable filter is updated so that vibration detected by the sensor does not undergo distortion with respect to the input signal; and
    a controller configured to perform, as an initial setting operation for the speaker distortion compensation device, an operation in which the controller calculates a non-linear parameter of the speaker as an active non-linear parameter and sets, in the non-linearity compensation filter, a transfer function that compensates for distortion in the output from the speaker with respect to the input signal, the distortion being due to the calculated active non-linear parameter;

wherein in the initial setting operation, the controller is configured to:

drive the speaker by using a predetermined test signal and measure a response from the speaker as a measured response value, the response being measured from vibration of the vibration system, the vibration being detected by the sensor with respect to the test signal, calculate error between the measured response value and a theoretical response value, which is a theoretical value of the response from the speaker when the non-linear parameter of the speaker, the non-linear parameter being theoretically determined from design specifications of the speaker, is taken as a non-linear parameter theoretical value and the non-linear parameter theoretical value is the non-linear parameter of the speaker, and calculate, when the calculated error is smaller than a threshold level, the non-linear parameter theoretical value as the active non-linear parameter.

2. The speaker distortion compensation device according to claim 1, wherein when the calculated error is not smaller than the predetermined level, the controller is configured to calculate, as the active non-linear parameter, a non-linear parameter that causes the response from the speaker to adapt to the measured response value.

3. The speaker distortion compensation device according to claim 2, wherein:

a plurality of pairs is stored in the controller, each pair being formed from a candidate active non-linear parameter, which is a candidate of the active non-linear parameter, and a reference response, which is the theoretical value of the response from the speaker when the candidate active non-linear parameter is the non-linear parameter of the speaker; and when the calculated error is not smaller than the predetermined level, the controller is configured to calculate, as the active non-linear parameter, the candidate active non-linear parameter paired with the reference response closest to the measured response value.

4. The speaker distortion compensation device according to claim 3, further comprising a status detection means that is configured to detect a status of the speaker;

wherein the controller is further configured to:

record, after an actual operation of the speaker distortion compensation device has started, a history of the status, detected by the status detection means, of the speaker, and infer a change in the non-linear parameter of the speaker from the recorded history, update the active non-linear parameter so as to follow the inferred change, and set, in the non-linearity compensation filter, a transfer function that compensates for distortion in the output from the speaker with respect to the input signal, the distortion being due to the updated active non-linear parameter.

5. The speaker distortion compensation device according to claim 4, wherein one of the non-linear parameters is a force factor in an equivalent circuit of the speaker.

6. A speaker unit comprising:

the speaker distortion compensation device according to claim 5; and the speaker;

wherein the speaker distortion compensation device and the speaker are combined with each other.

7. The speaker distortion compensation device according to claim 2, further comprising a status detection means that is configured to detect a status of the speaker;

wherein the controller is further configured to:

record, after an actual operation of the speaker distortion compensation device has started, a history of the status, detected by the status detection means, of the speaker, and infer a change in the non-linear parameter of the speaker from the recorded history, update the active non-linear parameter so as to follow the inferred change, and set, in the non-linearity compensation filter, a transfer function that compensates for distortion in the output from the speaker with respect to the input signal, the distortion being due to the updated active non-linear parameter.

8. The speaker distortion compensation device according to claim 7, wherein one of the non-linear parameters is a force factor in an equivalent circuit of the speaker.

9. A speaker unit comprising:

the speaker distortion compensation device according to claim 8; and the speaker;

wherein the speaker distortion compensation device and the speaker are combined with each other.

* * * * *